(12) United States Patent
Mi et al.

(10) Patent No.: US 12,543,515 B2
(45) Date of Patent: Feb. 3, 2026

(54) GROWTH-ANNEAL CYCLING OF A SEMICONDUCTOR LAYER

(71) Applicant: The Regents of the University of Michigan, Ann Arbor, MI (US)

(72) Inventors: Zetian Mi, Ann Arbor, MI (US); David Laleyan, Ann Arbor, MI (US); Ping Wang, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 562 days.

(21) Appl. No.: 17/912,830

(22) PCT Filed: Mar. 22, 2021

(86) PCT No.: PCT/US2021/023417
§ 371 (c)(1),
(2) Date: Sep. 19, 2022

(87) PCT Pub. No.: WO2021/189035
PCT Pub. Date: Sep. 23, 2021

(65) Prior Publication Data
US 2023/0141370 A1 May 11, 2023

Related U.S. Application Data

(60) Provisional application No. 62/992,246, filed on Mar. 20, 2020.

(51) Int. Cl.
*H01L 21/02* (2006.01)
*C30B 23/02* (2006.01)
(Continued)

(52) U.S. Cl.
CPC ...... *H01L 21/02631* (2013.01); *C30B 23/025* (2013.01); *C30B 29/403* (2013.01);
(Continued)

(58) Field of Classification Search
CPC .......... H01L 21/02631; H01L 21/0242; H01L 21/0254; H01L 21/02667; H01L 21/02381;
(Continued)

(56) References Cited

U.S. PATENT DOCUMENTS 9,269,569 B1* 2/2016 Han ................. H01L 21/02381
2001/0024884 A1* 9/2001 Fitzgerald ......... H01L 21/02543
438/761
(Continued)

FOREIGN PATENT DOCUMENTS

JP 2005145754 A 6/2005
JP 4073197 B2 2/2008
(Continued)

OTHER PUBLICATIONS

Extended European Search Report from European Patent Application No. 21772518, dated Jun. 12, 2024, 8 pages.
(Continued)

*Primary Examiner* — Norman D Richards
*Assistant Examiner* — Sean Ayers Winters
(74) *Attorney, Agent, or Firm* — Lempia Summerfield Katz LLC

(57) ABSTRACT

A method of fabricating a semiconductor device includes providing a substrate, implementing a growth procedure to form a semiconductor layer supported by the substrate, performing an anneal of the semiconductor layer, the anneal being conducted at a higher temperature than the growth procedure, and repeating the growth procedure and the anneal. The anneal is conducted at or above a decomposition temperature for the semiconductor layer.

22 Claims, 6 Drawing Sheets

(51) Int. Cl.
    C30B 29/40    (2006.01)
    C30B 33/02    (2006.01)
(52) U.S. Cl.
    CPC .......... C30B 33/02 (2013.01); H01L 21/0242 (2013.01); H01L 21/0254 (2013.01); H01L 21/02667 (2013.01); *H01L 21/02381* (2013.01); *H01L 21/02546* (2013.01)
(58) Field of Classification Search
    CPC .............. H01L 21/02546; C30B 23/025; C30B 29/403; C30B 33/02
    See application file for complete search history.

(56) References Cited

U.S. PATENT DOCUMENTS

| | | | | |
|---|---|---|---|---|
| 2002/0157596 | A1* | 10/2002 | Stockman | H01L 21/02579 438/689 |
| 2007/0248526 | A1 | 10/2007 | Spencer et al. | |
| 2010/0065855 | A1* | 3/2010 | Yokoyama | H01L 21/0237 257/E33.025 |
| 2015/0111341 | A1* | 4/2015 | Lee | H01L 21/268 438/799 |
| 2015/0362763 | A1* | 12/2015 | Wheeler | G01J 5/20 156/247 |
| 2016/0284811 | A1 | 9/2016 | Yu et al. | |
| 2018/0040764 | A1 | 2/2018 | Henley | |
| 2018/0047875 | A1 | 2/2018 | Bedell et al. | |
| 2018/0269105 | A1* | 9/2018 | Susai | H01L 21/187 |
| 2018/0274088 | A1 | 9/2018 | Miyake | |
| 2019/0006553 | A1 | 1/2019 | Jain | |

FOREIGN PATENT DOCUMENTS

| | | | |
|---|---|---|---|
| JP | 2008115023 | A | 5/2008 |
| JP | 2015032730 | A | 2/2015 |
| JP | 2017055116 | A | 3/2017 |

OTHER PUBLICATIONS

International Search Report and Written Opinion of the International Searching Authority from International Patent Application No. PCT/US2021/024317, dated Jun. 8, 2021, 8 pages.
A. Laubsch et al; Measurement of the internal quantum efficiency of InGaN quantum wells; Proceedings vol. 6486, Light-Emitting Diodes: Research, Manufacturing, and Applications XI; 2007, pp. 64860J.
A. Pandey et al.; Enhanced doping efficiency of ultrawide band gap semiconductors by metal-semiconductor junction assisted epitaxy; Phys. Rev. Mater. vol. 3, 2019; pp. 053401.
B. Heying et al.; Role of threading dislocation structure on the x-ray diffraction peak widths in epitaxial GaN films; Appl. Phys. Lett. vol. 68; 1996; pp. 643-645.
B.N. Pantha et al.; Correlation between optoelectronic and structural properties and epilayer thickness of AlN; Appl. Phys. Lett. vol. 90; 2007; pp. 241101.
C. Heinlein et al.; Plasma preconditioning of sapphire substrate for GaN epitaxy; Materials Science and Engineering: B vol. 43; 1997; pp. 253-257.
C. Xiong et al.; Aluminum nitride as a new material for chip-scale optomechanics and nonlinear optics; New Journal of Physics vol. 14; 2012; 095014; pp. 1-21.
C.-P. Huang et al.; High-quality AlN grown with a single substrate temperature below 1200 ° C.; Sci. Rep. vol. 7; 2017; pp. 1-6.
D. Li et al.; AlGaN photonics: recent advances in materials and ultraviolet devices; Advances in Optics and Photonics vol. 10, 2018; pp. 43-110.
D.A. Laleyan et al.; Effect of growth temperature on the structural and optical properties of few-layer hexagonal boron nitride by molecular beam epitaxy; Opt. Express vol. 26; 2018; pp. 23031-23039.
D.A. Laleyan et al.; Molecular beam epitaxy and characterization of Al0.6Ga0.4N epilayers; J. Cryst. Growth vol. 507; 2019; pp. 87-92.
D.D. Le et al.; Effect of First-Stage Growth Manipulation and Polarity of SiC Substrates on AlN Epilayers Grown Using Plasma-Assisted Molecular Beam Epitaxy; Korean J. Mater. Res. vol 24; 2014; pp. 266-270.
Extended European Search Report of the European Patent Office cited in corresponding European patent application No. 21772518.3-1103; Jun. 12, 2024; 8 pp.
F. Ren et al.; Effects of AlN nucleation layer thickness on crystal quality of AlN grown by plasma-assisted molecular beam epitaxy; Chinese Physics B vol. 19; 2010; pp. 116801.
G. Ferro et al.; RHEED monitoring of AlN epitaxial growth by plasma-assisted molecular beam epitaxy; J. Cryst. Growth vol. 210; 2000; pp. 429-434.
G.S. Lee et al.; Growth of AlN layer on patterned sapphire substrate by hydride vapor phase epitaxy; Jpn. J. Appl. Phys. vol. 55; 2016; pp. 05FC02.
H. Gong et al.; Investigation on the variation of the step-terrace structure on the surface of polished GaN wafer; Surfaces and Interfaces vol. 6; 2017; pp. 197-201.
H. Miyake et al.; Annealing of an AlN buffer layer in N2—CO for growth of a high-quality AlN film on sapphire; Appl. Phys. Express vol. 9; 2016; pp. 025501.
H. Miyake et al.; Preparation of high-quality AlN on sapphire by high-temperature face-to-face annealing; J. Cryst. Growth vol. 456, pp. 155-159; 2016.
H. Sun et al.; Influence of TMAl preflow on AlN epitaxy on sapphire; Appl. Phys. Lett. vol. 110; 2017; pp. 192106.
H.M. Foronda et al.; Low threading dislocation density aluminum nitride on silicon carbide through the use of reduced temperature interlayers; J. Cryst. Growth vol. 483; 2018; pp. 134-139.
I. Bryan et al.; Homoepitaxial AlN thin films deposited on m-plane (1100) AlN substrates by metalorganic chemical vapor deposition; J. Appl. Phys. vol. 116; 2014; pp. 133517.
International Preliminary Report on Patentability of the International Bureau from International Patent Application No. PCT/US2021/023417, dated Sep. 20, 2022, 7 pages.
J. Lemettinen et al.; MOVPE growth of N-polar AlN on 4H-SiC: Effect of substrate miscut on layer quality; J. Cryst. Growth vol. 487; 2018; pp. 12-16.
J. Lemettinen et al.; MOVPE growth of nitrogen- and aluminum-polar AlN on 4H-SiC; J. Cryst. Growth vol. 487; 2018; pp. 50-56.
J. Wang et al.; High quality AlN epilayers grown on nitrided sapphire by metal organic chemical vapor deposition; Scientific Reports vol. 7; 2017; pp. 42747.
J.D. Greenlee et al.; Defect reduction in MBE-grown AlN by multicycle rapid thermal annealing; Electron. Mater. Lett. vol. 12, 2016; pp. 133-138.
K.X. Chen et al.; Effect of dislocations on electrical and optical properties of n-type Al0.34Ga0.66N; Appl. Phys. Lett. vol. 93; 2008; pp. 192108.
L. Zhang et al.; High-quality AlN epitaxy on nano-patterned sapphire substrates prepared by nano-imprint lithography; Scientific Reports vol. 6; 2016; pp. 35934.
L. Zhang et al.; High-quality AlN epitaxy on sapphire substrates with sputtered buffer layers; Superlattices and Microstruct. vol. 105; 2017; pp. 34-38.
M. Kneissl et al.; Advances in group III-nitride-based deep UV light-emitting diode technology; Semiconductor Science and Technology vol. 26, 2011; 014036, pp. 1-6.
M. Lamprecht et al.; Slow decay of a defect-related emission band at 2.05 eV in AlN: Signatures of oxygen-related DX states; Phys. Status Solidi B vol. 254, 2017; 1600338; pp. 1-12.
M. Moseley et al.; Transient atomic behavior and surface kinetics of GaN; J. Appl. Phys. vol. 106; 2009; pp. 014905.
M. Nemoz et al.; Dislocation densities reduction in MBE-grown AlN thin films by high-temperature annealing; J. Cryst. Growth vol. 461; 2017; pp. 10-15.
M.J. Manfra et al.; Dislocation and morphology control during molecular-beam epitaxy of AlGaN/GaN heterostructures directly on sapphire substrates; Appl. Phys. Lett. vol. 81; 2002; pp. 1456-1458.

(56) References Cited

OTHER PUBLICATIONS

M.X. Wang et al.; Crystal quality evolution of AlN films via high-temperature annealing under ambient N2 conditions; CrystEngComm vol. 20; 2018, pp. 6613-6617.

M.X. Wang et al.; High-temperature annealing induced evolution of strain in AlN epitaxial films grown on sapphire substrates; Appl. Phys. Lett. vol. 114; 2019; pp. 112105.

N. Faleev et al.; Low density of threading dislocations in AlN grown on sapphire; J. Appl. Phys. vol. 101; 2007; pp. 093516.

N. Matsunami et al.; XRD Characterization of AlN Thin Films Prepared by Reactive RF-Sputter Deposition; Advances in Materials Physics and Chemistry vol. 3; 2013; pp. 101-107.

N. Onojima et al.; 4H-polytype AlN grown on 4H-SiC (1120) substrate by polytype replication; Appl. Phys. Lett. vol. 83; 2003; pp. 5208-5210.

Office Action cited in corresponding Chinese patent application No. 202180031260.3; May 27, 2024; 21 pp.

P. Lu et al.; Seeded growth of AlN on SiC substrates and defect characterization; J. Cryst. Growth vol. 310; 2008; pp. 2464-2470.

P.L. Galindo et al.; The Peak Pairs algorithm for strain mapping from HRTEM images; Ultramicroscopy vol. 107; 2007; pp. 1186-1193.

R. Page et al.; Rotationally aligned hexagonal boron nitride on sapphire by high-temperature molecular beam epitaxy; Phys. Rev. Mater. vol. 3, 2019; pp. 064001.

R.D. Vispute et al.; High quality epitaxial aluminum nitride layers on sapphire by pulsed laser deposition; Appl. Phys. Lett. vol. 67; 1995; pp. 1549-1551.

S. Hagedorn et al.; High-quality AlN grown on a thermally decomposed sapphire surface; J. Cryst. Growth vol. 479, 2017; pp. 16-21.

S. Tojo et al; Influence of high-temperature processing on the surface properties of bulk AlN substrates; J. Cryst. Growth vol. 446; 2016; pp. 33-38.

S. Xiao et al.; Improvement mechanism of sputtered AlN films by high-temperature annealing; J. Cryst. Growth vol. 502; 2018; pp. 41-44.

S. Yoshida et al.; Epitaxial growth of aluminum nitride films on sapphire by reactive evaporation; Appl. Phys. Lett. vol. 26; 1975; pp. 461-462.

S.C. Jain et al.; III-nitrides: Growth, characterization, and properties; J. Appl. Phys. vol 87; 2000; pp. 965-1006.

S.R. Lee et al.; Effect of threading dislocations on the Bragg peakwidths of GaN, AlGaN, and AlN heterolayers; Appl. Phys. Lett. vol. 86; 2005; pp. 241904.

T. Shibata et al.; Characterization of high-quality epitaxial AlN films grown by MOVPE; MRS Online Proceedings Library vol. 693; 2001; pp. 1-4.

T.-J. Lu et al.; Aluminum nitride integrated photonics platform for the ultraviolet to visible spectrum; Optics Express vol. 26, 2018; pp. 11147-11160.

T.S. Argunova et al.; Distribution of Dislocations near the Interface in AlN Crystals Grown on Evaporated SiC Substrates; Crystals vol. 7; 2017; pp. 1-12.

T.S. Cheng et al.; High-Temperature Molecular Beam Epitaxy of Hexagonal Boron Nitride with High Active Nitrogen Fluxes; Materials vol. 11, 2018; pp. 1119.

V. Kueller et al.; Growth of AlGaN and AlN on patterned AlN/sapphire templates; J. Cryst. Growth vol. 315; 2011; pp. 200-203.

V.M. Kaganer et al.; X-ray diffraction peak profiles from threading dislocations in GaN epitaxial films; Phys. Rev. B vol. 72; 2005; pp. 045423.

W. Luo et al.; Influence of the nucleation layer morphology on the structural property of AlN films grown on c-plane sapphire by MOCVD; Journal of Alloys and Compounds vol. 697; 2017; pp. 262-267.

X. Zhang et al.; Epitaxial growth of AlN films on sapphire via a multilayer structure adopting a low- and high-temperature alternation technique; CrystEngComm vol. 17, 2015; pp. 7496-7499.

X.- H. Li et al.; Growth of high-quality AlN layers on sapphire substrates at relatively low temperatures by metalorganic chemical vapor deposition; Phys. Status Solidi B vol. 252; 2015; pp. 1089-1095.

X.- H. Li et al.; Temperature dependence of the crystalline quality of AlN layer grown on sapphire substrates by metalorganic chemical vapor deposition; J. Cryst. Growth vol. 414; 2015; pp. 76-80.

Y. Taniyasu et al.; Origin of exciton emissions from an AlN p-n junction light-emitting diode; Appl. Phys. Lett. vol. 98; 2011; pp. 131910.

Z. Chen et al.; High quality AlN grown on SiC by metal organic chemical vapor deposition; Appl. Phys. Lett. vol. 93; 2008; pp. 191906.

Z. Chen et al.; Improvement of AlN Film Quality by Controlling the Coalescence of Nucleation Islands in Plasma-Assisted Molecular Beam Epitaxy; Chin. Phys. Lett. vol. 27; 2010; pp. 058101.

Z.Y. Fan et al.; Defect annihilation in AlN thin films by ultrahigh temperature processing; Appl. Phys. Lett. vol. 76, 2000; pp. 1839-1841.

S. Kitagawa et al.; High-quality AlN growth on 6H-SiC substrate using three dimensional nucleation by low-pressure hydride vapor phase epitaxy; Japanese Journal of Applied Physics vol. 53; 2014; 05FL03; pp. 1-5.

First Office Action in Chinese Patent Application No. 202180031260.3, dated May 27, 2024, 21 pages (including English translation).

Notification of Third Office Action in Chinese Patent Application No. 202180031260.3, dated Mar. 24, 2025, 14 pages (including English translation).

Erich Kasper, "Properties of Strained and Relaxed Silicon Germanium", Book, pp. 65-70, Sep. 30, 2002.

Japanese Office Action in Japanese Patent Application No. 2022-556557 mailed on Oct. 29, 2024, 9 pages (including English translation).

Second Office Action in Chinese Patent Application No. 202180031260.3, dated Nov. 22, 2024, 16 pages (including English translation).

Final Rejection in Japanese Patent Application No. 2022-556557, dated May 7, 2025, 7 pages (including English translation).

Fourth Office Action in Chinese Patent Application No. 202180031260.3, dated Jun. 28, 2025, 15 pages (including English translation).

* cited by examiner

GROWTH-ANNEAL CYCLING OF A SEMICONDUCTOR LAYER

CROSS-REFERENCE TO RELATED APPLICATION

This U.S. National Phase application is based on International Application No. PCT/US2021/023417, filed Mar. 22, 2021, which claims the benefit of U.S. provisional application entitled "Semiconductor Growth-Anneal Cycling," filed Mar. 20, 2020, and assigned Ser. No. 62/992,246, the entire disclosures of which are hereby expressly incorporated by reference. Priority benefit of these earlier filed applications is hereby claimed.

STATEMENT REGARDING FEDERALLY SPONSORED RESEARCH OR DEVELOPMENT

This invention was made with government support under Contract No. W911NF-17-1-0109 awarded by the Army Research Office (ARO). The government has certain rights in the invention.

BACKGROUND OF THE DISCLOSURE

Field of the Disclosure

The disclosure relates generally to semiconductor devices.

Brief Description of Related Technology

High-quality aluminum nitride (AlN) epitaxially grown on a sapphire substrate is useful in a broad range of applications, including, for example, mid and deep ultraviolet (UV) optoelectronics and high power/frequency electronics. Also, with a wide bandgap and transparency down to about 0.2 μm wavelengths, AlN on sapphire has emerged as a useful material for integrated UV, visible and quantum photonics, enabling a broad range of classical/non-classical applications in photonics. Moreover, for high-power photonic applications, an ultrawide bandgap material such as AlN is useful to avoid nonlinear absorption.

The quality of AlN on sapphire has been severely limited by large densities of defects and dislocations, and undesired impurity incorporation (e.g., carbon and oxygen). Past growth methods of AlN on sapphire, mainly by metalorganic chemical vapor deposition (MOCVD), involve the use of relatively thick buffer layers, and techniques such as epitaxial lateral overgrowth and patterned substrates to reduce the formation of dislocations and obtain a usable AlN epitaxial template. Yet, and unfortunately, many applications such as AlN waveguides and micro-ring resonators operating in the UV spectra, use a very thin AlN epilayer.

AlN has been deposited on sapphire using a sputtering method. The use of ultrahigh-temperature annealing significantly improved the quality of the sputtered AlN layers. Such high-temperature annealing, however, may degrade the surface morphology and negatively impact the dopant distribution in optoelectronic and electronic devices.

SUMMARY OF THE DISCLOSURE

In accordance with one aspect of the disclosure, a method of fabricating a semiconductor devices includes providing a substrate, implementing a growth procedure to form a semiconductor layer supported by the substrate, performing an anneal of the semiconductor layer, the anneal being conducted at a higher temperature than the growth procedure, and repeating the growth procedure and the anneal. The anneal is conducted at or above a decomposition temperature for the semiconductor layer.

In accordance with another aspect of the disclosure, a method of fabricating a semiconductor devices includes providing a substrate, implementing a growth procedure to form a semiconductor layer on the substrate, performing an anneal of the semiconductor layer, the anneal being conducted at a higher temperature than the growth procedure, and repeating the growth procedure and the anneal. The anneal is conducted at a temperature at which decomposition of the semiconductor layer occurs.

In accordance with yet another aspect of the disclosure, a method of fabricating a semiconductor devices includes providing a substrate, implementing an epitaxial growth procedure to form a semiconductor layer on the substrate, performing an anneal of the semiconductor layer, the anneal being conducted at a higher temperature than the epitaxial growth procedure, and repeating the epitaxial growth procedure and the anneal for multiple cycles. The anneal is conducted at a temperature at which decomposition of the semiconductor layer occurs.

In connection with any one of the aforementioned aspects, the methods described herein may alternatively or additionally include or involve any combination of one or more of the following aspects or features. Repeating the growth procedure and the anneal includes repeating the growth procedure and the anneal for multiple cycles. The growth procedure and the anneal are implemented without exposure of the semiconductor layer to ambient conditions between the growth procedure and the anneal. The anneal is performed in a growth chamber in which the growth procedure is implemented. The growth procedure and the anneal are conducted in different chambers. The method further includes implementing a further growth procedure to further form the semiconductor layer after repeating the growth procedure and the anneal. The further growth procedure is implemented in metal-rich conditions. The anneal is performed in a plasma environment of the growth procedure. The growth procedure is implemented, and the anneal is performed, in the growth chamber in nitrogen-rich conditions. The growth procedure includes an epitaxial growth procedure. Implementing the growth procedure includes growing the semiconductor layer directly on the substrate. The substrate has a uniform composition differing from the semiconductor layer. The semiconductor layer includes aluminum nitride. The substrate includes sapphire. The semiconductor layer includes a III-V semiconductor material. Performing the anneal includes gradually increasing a temperature of the growth chamber. The anneal is performed at a temperature over 50% higher than the epitaxial growth procedure. The semiconductor layer and the substrate have a lattice mismatch. The method further includes depositing a capping layer on the semiconductor layer after implementing the growth procedure and before performing the anneal. The capping layer includes aluminum oxide.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 1:
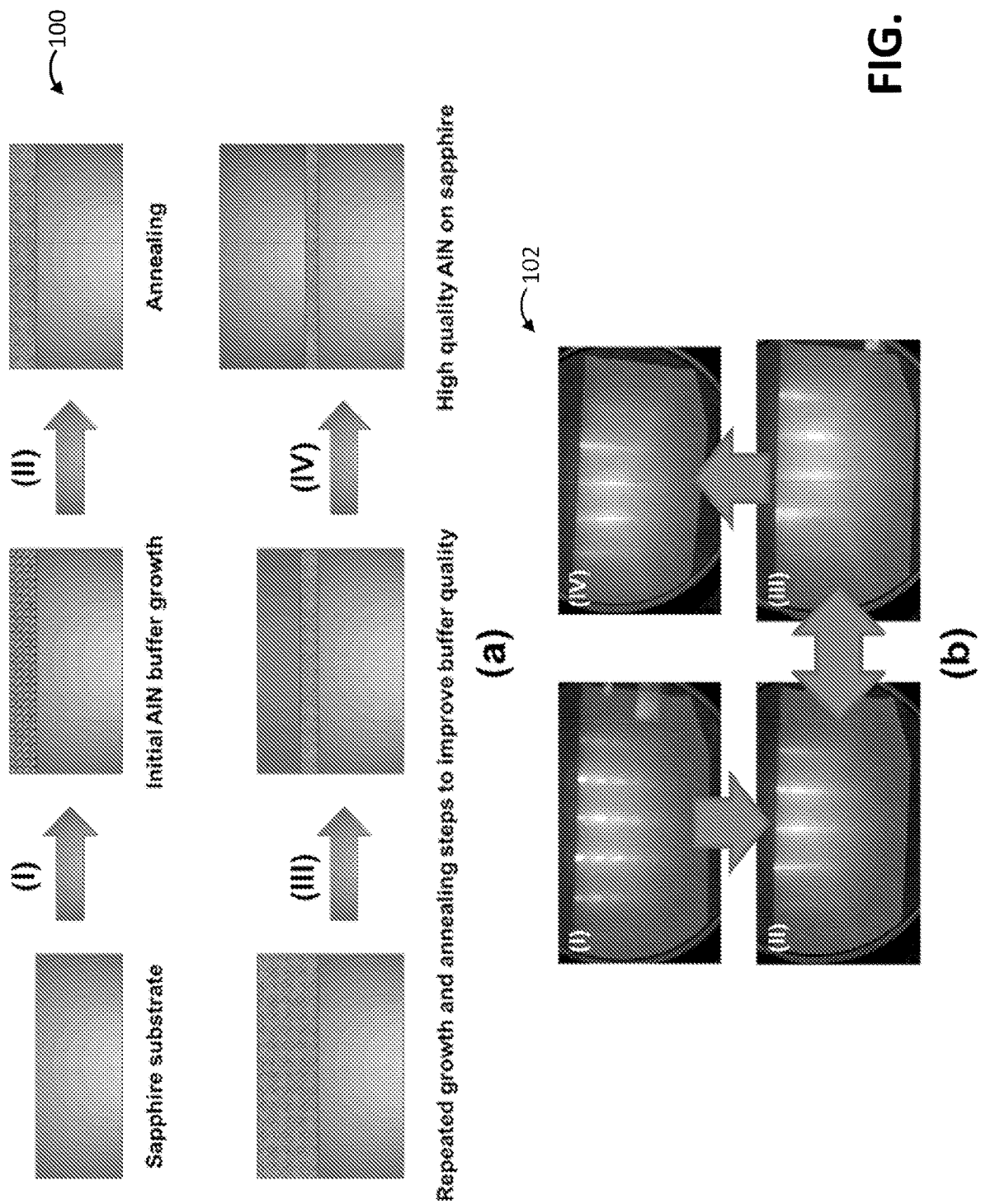
FIG. 1 depicts cross-sectional schematic views and images of a semiconductor device having a semiconductor layer grown with growth-anneal cycling in accordance with one example.

The embodiments of the disclosed methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Described are methods of fabricating devices in which a semiconductor layer is formed via a combination (e.g., repetition) of growth and annealing procedures. The repetition of the growth and annealing procedures provides an approach to eliminate, minimize, or otherwise reduce defect and dislocation formation in the semiconductor layer. As described herein, a growth procedure (e.g., an epitaxial growth procedure) and an anneal are repeated (e.g., multiple cycles). The anneal may or may not be performed in a growth chamber in which the epitaxial or other growth procedure is implemented or otherwise without exposure of the semiconductor layer to ambient conditions between growth and anneal. The disclosed methods may thus cycle between growth and annealing without exposure to the ambient environment in some cases. Ultrathin semiconductor layers (e.g., films) may thus be grown by molecular beam epitaxy using an in situ high-temperature annealing approach. In some cases, the semiconductor layer may be or include an aluminum nitride (AlN) layer (e.g., an epilayer) grown on (e.g., grown directly on) a sapphire substrate.

The anneal is conducted at a higher temperature than the epitaxial or other growth procedure. For instance, the anneal is conducted at or above a decomposition temperature for the semiconductor layer. Thus, in some cases, the anneal is conducted at a temperature at which decomposition of the semiconductor layer occurs. In other cases, the anneal may not result in decomposition of the semiconductor layer despite being at or above the decomposition temperature due to, for instance, the presence of a cap layer or other layer. The decomposition temperature may vary, for instance, in accordance with the composition of the semiconductor layer and anneal conditions (e.g., overpressure).

Decomposition of the compound semiconductor materials (e.g., AlN) of the semiconductor layers being grown involves breaking of the chemical bonds of the semiconductor to produce the constituent elements (e.g., Al and N). The constituent elements may then desorb off of the surface, resulting in a thinning of the film or layer in the process of being grown. The decomposition temperature and decomposition rate may vary in conjunction with the strength of the bonds of the semiconductor being grown. The annealing temperature of the disclosed methods may vary accordingly. In some cases, an annealing temperature is selected that is sufficiently high to promote the crystallization or recrystallization of the semiconductor material (which involves breaking and re-forming bonds), but without excessive bond breaking so as to completely decompose the entire film or layer being grown. The annealing temperature may thus be optimized for a given semiconductor material and desired growth rate.

Using the disclosed methods, high quality (e.g., strain-free), ultrathin semiconductor layers have been grown despite a lattice mismatch between a substrate and the semiconductor layer. As described herein, transmission electron microscopy analysis shows that AlN epilayers formed via the disclosed methods are strain relaxed within the first nanometer (nm), thus growing nearly strain free. Many of the dislocations generated at the AlN/sapphire interface are reduced within the first 50 nm of growth. Examples of epitaxial films grown directly on sapphire that are about 100 nm thick show X-ray diffraction (XRD) (002) and (102) rocking curve peaks with full widths at half maximum (FWHM) of less than 150 and 1400 arcsec, respectively, which are the narrowest linewidths reported for AlN of such thickness. Photoluminescence analysis further showed that such AlN epilayers exhibit relatively high luminescence efficiency and strong near-band-edge emission without defect-related transitions.

Although described in connection with the formation of AlN buffer layers on sapphire substrates, the disclosed methods may be used to form a wide variety of semiconductor layers. For instance, the disclosed methods may be used to form active and other layers in various types of devices. The positioning, function, and other characteristics of the layers may vary from the examples described herein accordingly. The disclosed methods may be used to form other compound semiconductors, such as III-nitride semiconductors (e.g., AlGaN), other III-V semiconductors, II-VI semiconductors, and oxide semiconductors. The annealing of the disclosed methods may vary accordingly. For instance, the annealing of non-nitride III-V semiconductors may be implemented under a corresponding Group V flux, rather than in a nitrogen environment formed via nitrogen plasma and/or ammonia gas. The semiconductor layers may be formed on other substrates. For example, substrates composed of, or otherwise including, Si, SiC, $Ga_2O_3$, diamond, highly oriented pyrolytic graphite (HOPG), GaAs, InP, and GaSb, may also be used.

The nature of the semiconductor devices fabricated via the disclosed methods may vary. The semiconductor devices may be or otherwise include high efficiency and high power deep-UV light-emitting diodes (LEDs) and laser diodes. Other types of optoelectronic devices and/or high power/frequency electronic devices may be fabricated. Alternatively or additionally, the semiconductor devices may be configured for applications involving a wide range of wavelengths, including, but not limited to the UV and visible bands. The semiconductor devices may be configured for implementation of various applications of quantum photonics, including a broad range of both classical and non-classical applications in photonics, such as high-power photonic applications. The nature of the semiconductor device may thus vary considerably.

Molecular beam epitaxy (MBE) is useful in connection with the epitaxy of III-V and other semiconductors, such as AlN and Al-rich AlGaN. For instance, MBE provides more controlled nucleation and Al incorporation, efficient Mg dopant activation, and reduced impurity incorporation. However, reports of high-quality AlN epilayers by MBE have been lacking in the past, largely due to the limited growth temperature of conventional systems. Recent advances in MBE substrate heater technology, with reports of the growth of high-temperature materials, such as boron nitride (BN), may be used to overcome these challenges.

As described herein, molecular beam epitaxy may be used to form high-quality ultrathin AlN epilayers grown directly on sapphire. The disclosed methods may use multiple-cycle in situ high-temperature annealing to this end. With the use of in situ high-temperature annealing, the dislocation densities are significantly reduced. In one example of AlN having a thickness of about 0.1 µm, grown directly on sapphire, the (002) linewidth measured by X-ray diffraction (XRD) was less than 150 arcsec, which is comparable to, or better than, epilayers grown directly on an AlN substrate. The (102) linewidth was substantially reduced with the use of in situ high-temperature annealing from over 4000 arcsec to less than 1400 arcsec. Through detailed temperature-dependent photoluminescence (PL) measurements, a luminescence efficiency about 30% was measured at room temperature. Detailed scanning transmission electron microscopy (STEM) indicated the propagation of dislocations was largely suppressed in the thin AlN epilayers grown directly on sapphire, and that the AlN layer was grown fully-strain-relaxed. Significantly improved results were also measured for AlN epilayers with increased thicknesses.

FIG. 1 schematically depicts a method 100 of fabricating a semiconductor device in accordance with an example in which an AlN layer is grown on a c-plane sapphire substrate. Alternative or additional semiconductor layers may be grown. Other substrates may be used. In some cases, the method may use a plasma-assisted MBE system, such as a Veeco GENxplor radio frequency (RF) nitrogen plasma-assisted MBE system. The MBE system may be equipped with an Al effusion source, such as an AI SUMO effusion source, and a substrate heater, such as a NOVA ultrahigh-temperature substrate heater (e.g., heating up to 1850° C.). In this case, the sapphire wafer backside was metallized with molybdenum to allow for efficient heat conduction in vacuum.

FIG. 1 includes a part (a) in which schematic of the growth sequence of AlN on sapphire substrate is depicted. In this example, the growth sequence includes a stage I for initial AlN buffer growth using a modified migration-enhanced epitaxy (MEE) process, a stage II for high-temperature annealing of the grown ultrathin film, a stage III for repeated growth and annealing steps to improve the buffer layer quality, and a stage IV for epitaxy of high-quality AlN epilayers using an interruption-assisted process. FIG. 1 also includes a part (b) in which photographs of RHEED patterns observed during growth are depicted. In this example, the RHEED patterns include (I) a spotty and segmented pattern during the initial stage of growth, (II) a streakier pattern during the buffer stages, (III) a broadened and brighter pattern during the annealing stages, and (IV) a narrow streaky pattern during the epilayer growth stage.

As schematized in Part (a) of FIG. 1, stage I of the method 100 includes growth of a buffer (or other) layer using, e.g., a modified migration-enhanced epitaxy (MEE) approach to promote AlN nucleation and a smooth interface directly over the lattice-mismatched sapphire. In this example, the layer has a thickness of about 80 nm, but other thicknesses may be used. The growth temperature may be about 950° C. An Al flux of 8×10−8 Torr in beam equivalent pressure (BEP), and a low nitrogen flow rate of 0.3 sccm at a constant RF plasma forward power of 350 W, may be used. These parameters correspond to a slightly nitrogen-rich condition at this growth temperature.

In one example, stage I may have a shutter sequence of 1 min of Al (i.e., forcing a metal-rich surface coverage) followed by four minutes of both Al and N (e.g., nearly stochiometric AlN growth with a thin liquid-metal surface). The shutter sequence was determined to be useful by monitoring reflection high electron energy diffraction (RHEED) patterns 102 shown in Part (b) of FIG. 1.

As shown in Part (b) of FIG. 1, in the first minutes of growth, the RHEED pattern 102 becomes segmented and spotty due to the lattice-mismatched nucleation (Pattern I), but quickly starts recovering to a streakier pattern, indicative of two-dimensional epitaxial growth within the third modulation loop. The RHEED pattern 102 is streaky by the end of this first or initial buffer stage (Pattern II).

After the initial growth stage, Stage II of the method 100 includes gradually raising the substrate temperature. In one example, the temperature of the chamber (and, thus, substrate) is raised to about 1550° C. The example is thus in situ annealed for 30 minutes, e.g., under the same nitrogen plasma environment. This annealing step is useful for promoting a recrystallization of the buffer layer and obtaining significantly higher quality AlN epilayers in the later stages of growth. During this high-temperature annealing process, there may be decomposition of the AlN buffer even in the presence of the nitrogen plasma, and a broadening of the RHEED pattern is seen (Pattern III). Higher annealing temperatures promote recrystallization, leading to superior material properties, but may increase the decomposition and roughening of the grown film.

Other anneal temperatures and durations may be used. For instance, the anneal temperature may fall in a range from about 650 Celsius to about 850 Celsius for GaAs grown on Si, from about 850 Celsius to about 1000 Celsius for GaN grown on AlN or sapphire, and from about 1000 Celsius to about 1400 Celsius for AlGaN grown on sapphire (depending on Al composition). The duration of the anneal may vary accordingly.

The rate of decomposition may increase with increasing anneal temperature. The growth and decomposition rates may thus be tailored. For instance, the anneal temperature and/or other anneal conditions (e.g., overpressure) may be tailored to ensure that the annealing step does not entirely decompose the grown thin films. Alternatively or additionally, the decomposition may be controlled via nitrogen and/or other overpressure. Such nitrogen or other overpressure may bombard the surface of the semiconductor layer with nitrogen, which may result in re-formation of the compound semiconductor (e.g., AlN) bonds being broken due to the anneal temperature. The decomposition rate may thus be decreased or otherwise controlled.

The anneal temperature may be selected to achieve a desired decomposition rate. In examples involving the growth of AlN in vacuum (i.e., without nitrogen overpressure), decomposition starts around 1200° C. In one test, decomposition was negligible below an annealing temperature of 1400° C. The decomposition rate increased superlinearly with increasing temperatures. For instance, decomposition rates of about 30 nanometers per hour (nm/h), about 120 nm/h, about 180-200 nm/h were realized at annealing temperatures of 1450° C., 1550° C., and 1600° C. respectively. The decomposition rate was difficult to measure at temperatures above about 1600° C. due to significant roughening of the semiconductor layer surface.

In some cases, each growth/annealing cycle resulted in at least about 10 nm of the AlN buffer layer thickness remaining. This effect is shown in STEM images of the AlN thin film cross section of FIG. 2. When reinitiating the growth following the annealing stage, the RHEED pattern 102 (FIG. 1) shows inverted V-shaped chevron features consistent with facets having formed at the surface.

Stages I (growth) and II (annealing) are repeated to improve the quality of the AlN template or layer. For instance, after three such cycles, the thickness of AlN buffer layer is about 30 nm. Additional or fewer cycles may be used. For instance, one test involving additional cycling yielded similar results as those with three cycles of growth/annealing.

The cycling may end with the growth of a final buffer layer (Stage III). The final buffer layer may be grown in a similar manner as Stage I, and/or in different manner, e.g., different growth conditions. The growth conditions may thus vary depending on, for instance, layer composition and/or other aspects. This stage may be configured to help recover and smoothen the faceted surface.

In the example of FIG. 1, the method 100 includes a further growth procedure to form the remainder of the AlN layer (Stage IV). In some cases, the remainder may be grown with the parameters unchanged from the previous growth procedures. In other cases, the growth conditions may be directed to nearly stoichiometric growth conditions. Alternatively or additionally, the metal (e.g., Al) flux is increased (e.g., to $1.1 \times 10^{-7}$ Torr) to shift the growth into metal-rich conditions (e.g., slightly metal-rich conditions). Periodic interruptions of the source-metal fluxes may be utilized to help with this process, such that the streaky RHEED pattern (Pattern IV) is maintained without the buildup of excess metallic Al. Under these conditions, a growth rate of about 180 nm/hour is achieved. Using this growth process, examples with varying AlN thickness, between 0.1 to 1 µm, may be achieved by adjusting the duration of this final stage of growth.

The final stage of growth may be optional. For instance, the method 100 may be implemented without the final stage of growth to form a thinner semiconductor layer. Such thin semiconductor layers have been the most challenging to obtain in high crystalline quality with prior methods.

The bulk structural properties of several example semiconductor layers grown in accordance with the disclosed methods were characterized by electron microscopy and XRD. For instance, a thin AlN example grown directly on sapphire was investigated using a FEI Titan Cubed 80-300 STEM equipped with CEOS correctors on both the probe and image forming lens systems, and operated at an accelerating voltage of 200 kV. Peak pair analysis (PPA) software was used to study the local lattice parameter distribution in the structure. Electron-transparent specimens of AlN/sapphire were prepared for STEM analysis by focused ion beam (FIB) using a Zeiss NVision 40 dual-beam instrument operating at 30 keV.

Figure 2:
FIG. 2 depicts images of the semiconductor layer of FIG. 1 in greater detail, along with graphical plots of a strain map and a strain profile for the semiconductor layer.
Figure 2:
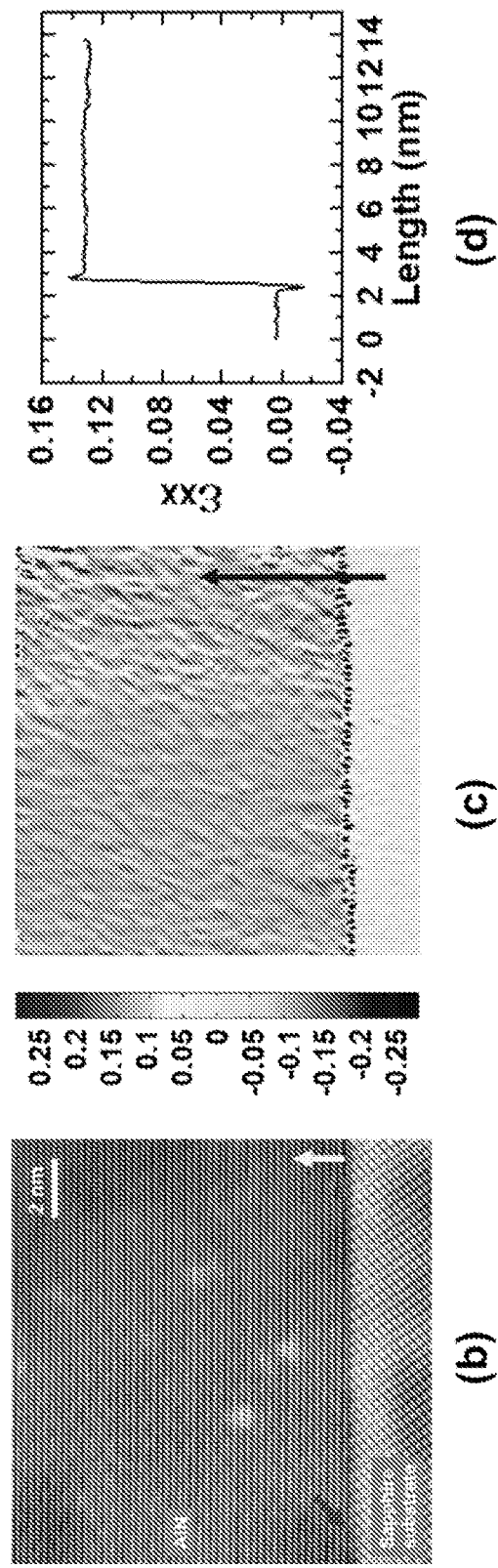

FIG. 2 includes a part (a) in which a STEM cross-sectional image is shown. A yellow arrow is depicted to indicate the growth direction. FIG. 2 also includes a part (b) in which a high-magnification STEM image of the AlN and sapphire interface is depicted. An arrow highlights an atomic step height mismatch at the interface. FIG. 2 also includes a part (c) xxx strain map (in the direction contained in the growth plane) obtained during the analysis, with the strain values (taking sapphire as the zero reference) in the included color scale bar. FIG. 2 also includes a part (d) in which a strain profile taken along the map in part (c) denoted by the arrow is depicted.

Part (a) of FIG. 2 shows a STEM image in cross section taken in medium angle conditions to more prominently reveal the defects in the example. The two layers of the structure have been marked by white arrows. The AlN layer thickness has been measured to be about 100 nm. Threading dislocations (TDs) crossing the AlN layer appear to be present in the image. This type of defect may release the strain at interfaces with high lattice mismatch as in the case of AlN/sapphire. From this STEM image, a significant number of the initially formed TDs are then terminated and stop propagating within the first 50 nm of growth, consistent with the initial buffer layers before and after the multiple in situ annealing cycles. In contrast, in previous reports, several hundred nanometers of buffer layer were used to obtain a desired top layer, and most dislocations generated in these layers propagated all the way to the surface. Another noteworthy finding from these examples is the presence of misorientations in the AlN film that were directly due to steps on the sapphire surface causing a small misalignment (less than 1 degree). These observations reveal the impact of the substrate surface on the epilayers, and that precise control of the initial interface is useful to growing high-quality AlN.

Part (b) of FIG. 2 shows a high-magnification STEM image of the interface between the AlN layer and the sapphire substrate. The brighter spots seen in the example are due to contamination/redeposition from the FIB example preparation process. The interface between both materials is very smooth, but atomic steps can be observed, such as the one marked with an arrow. In order to obtain quantitative information about the local atomic displacements in the AlN layer compared to the sapphire substrate (the zone of reference), PPA has been applied to part (b) of FIG. 2. Part (c) of FIG. 2 presents the xxx strain (defined with respect to a reference area) map, in the direction contained in the growth plane, obtained during the analysis. No noticeable strain variations are observed in the sapphire substrate (because it is taken as reference) given that the values are near zero. However, a variation in lattice parameter can be clearly observed in the AlN layer. When taking the substrate as a reference, the apparent "strain" value, i.e., the difference compared to the reference sapphire, has been measured as 13.1±0.2% based on the plot profile in part (d) of FIG. 2 taken along the map. This value agrees with the lattice mismatch expected between AlN and sapphire, 13.3%, suggesting that the AlN layer is grown almost fully relaxed, as it is extremely close to maintaining its bulk lattice parameter.

Figure 3:
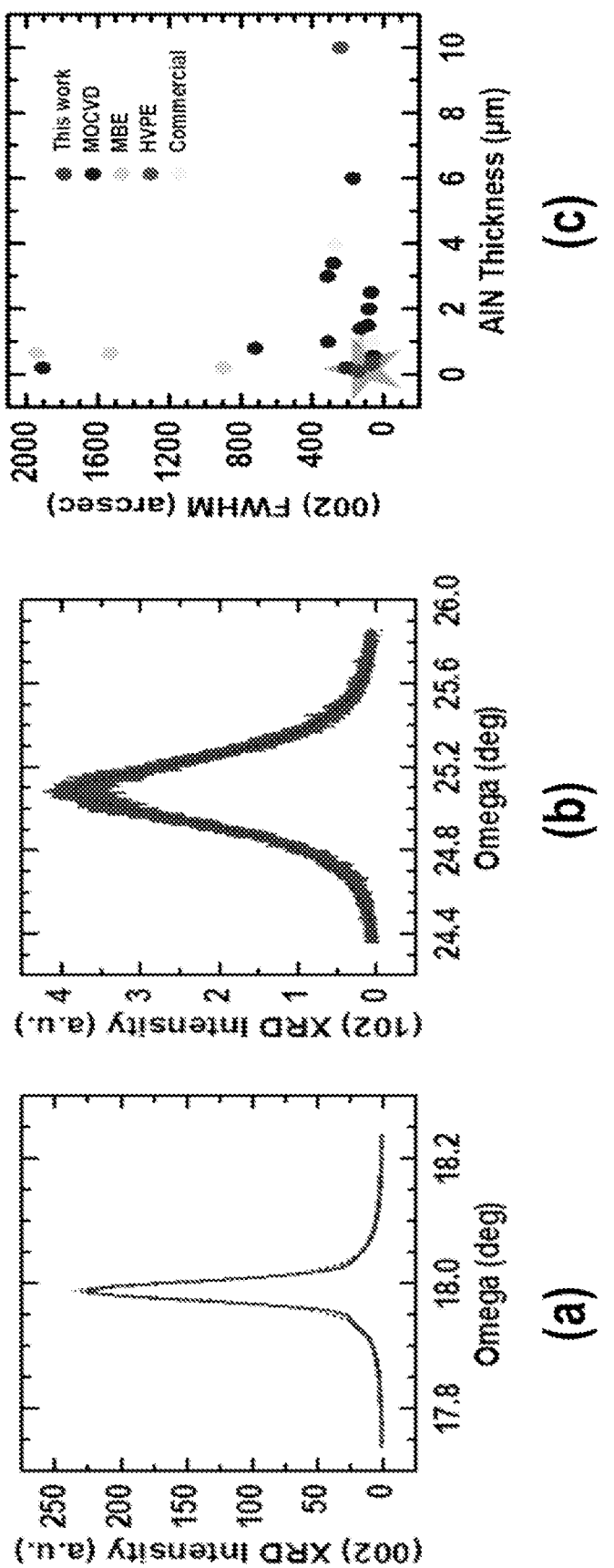
FIG. 3 depicts graphical plots of intensity curves and linewidths of reflections off of the semiconductor layer of FIG. 1.

FIG. 3 includes parts (a) and (b) to depict XRD rocking curves (shown as continuous lines) of the symmetrical (002) and asymmetrical (102) reflections of an AlN layer grown on sapphire substrate, respectively. The dotted curves are the Lorentz fitting of each curve, used to obtain a FWHM of 126 arcsec and 1387 arcsec for parts (a) and (b), respectively. FIG. 3 also includes a part (c) in which a comparison of AlN XRD (002) rocking curve linewidths previously reported in literature and that of this disclosure (in red) are presented.

XRD analysis was performed using a Rigaku SmartLab X-ray Diffractometer with a Ge (220) two-bounce monochromator aligned for thin-film rocking curve analysis. For a example having a thickness of about 100 nm, the measured XRD (002) rocking curve is shown in part (a) of FIG. 3. Its peak full width at half maximum (FWHM) is 126 arcsec based on a Lorentz fitting. The (102) linewidth (FWHM) is 1387 arcsec, based on a Lorentz fitting of the curve from part (b) of FIG. 3. These are the narrowest linewidths reported for AlN epilayers of comparable thickness grown by any technique, as highlighted in part (c) of FIG. 3. In contrast, for an example grown with similar thickness but without the use of the multiple-cycle in situ annealing steps, the (102) linewidth is over 4000 arcsec. The higher annealing temperatures may help obtain a narrower linewidth, up to a limit above which a worsening of the (002) linewidth is observed and the surface becomes increasingly difficult to recover. These observations are consistent with the fact that the (102) FWHM will become narrower with overall reduced threading dislocation densities, especially edge dislocations, while the (002) linewidth is sensitive to screw dislocations that will remain regardless of the subsequent epitaxy or other growth process.

Figure 4:
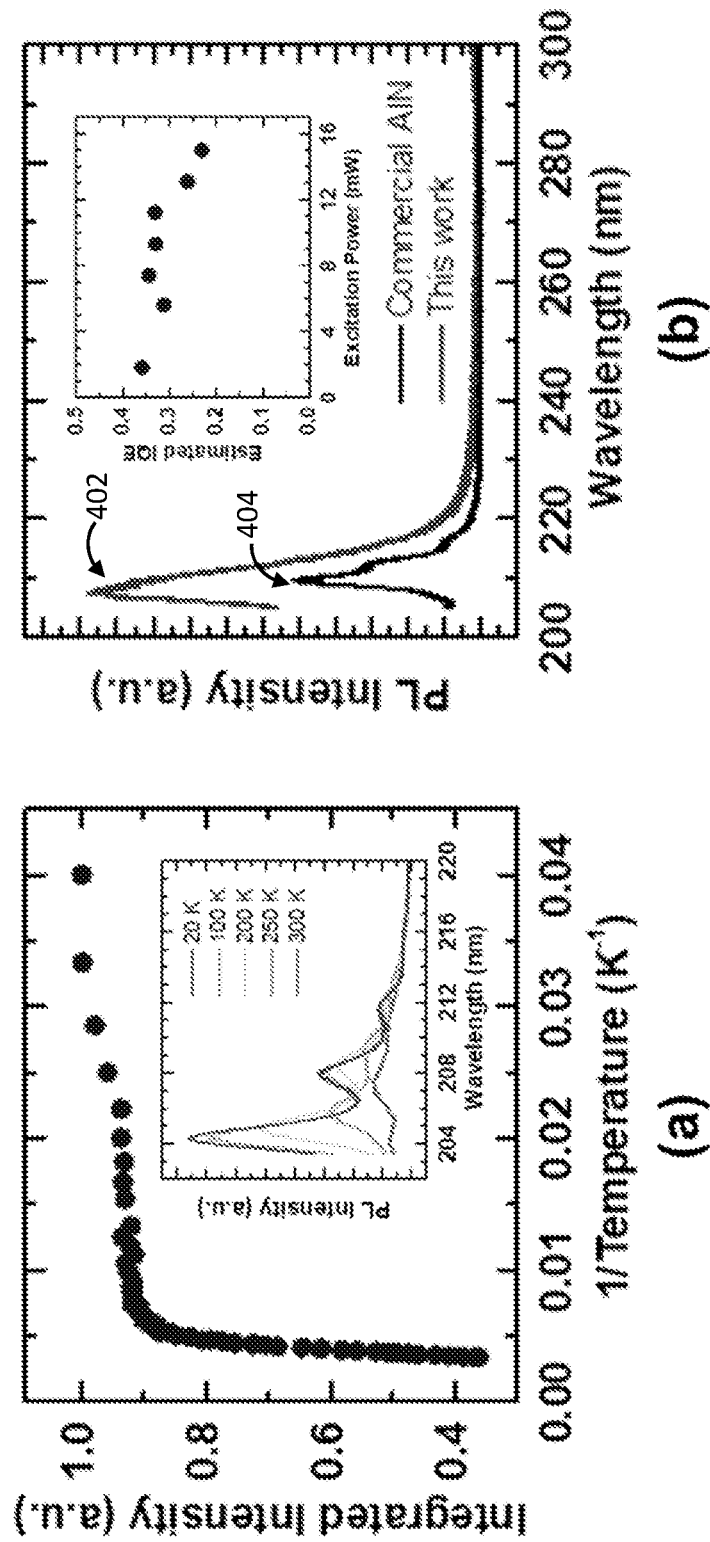
FIG. 4 depicts graphical plots of integrated intensity as a function of temperature and wavelength for the semiconductor layer of FIG. 1, along with a graphical plot of the emission spectra of the semiconductor layer of FIG. 1 at various temperatures.

FIG. 4 includes a part (a) in which normalized temperature dependence of the integrated PL intensity of an AlN example is depicted. The inset shows the emission spectra under constant excitation power at various temperatures. FIG. 4 also include a part (b) in which a comparison of the PL intensity of the same example (402) and a commercial AlN epitaxial template (404) that is about 10 times thicker is presented. The inset shows the estimated internal quantum efficiency (IQE) of about 30% of the example.

Optical properties of the thin AlN epilayer (e.g., a thickness of about 100 nm) grown directly on sapphire were characterized using variable excitation power and temperature-dependent photoluminescence (PL) spectroscopy with a 193 nm ArF excimer laser as the excitation source. The example emissions were spectrally resolved by a Horiba iHR550 spectrometer and a UV-sensitive Symphony II CCD detector. At cryogenic temperatures, the excitonic emission of AlN at about 205 nm is accompanied by lower-energy shoulder emissions that can be attributed to its longitudinal optical (LO) phonon replica, shown in the inset of part (a) of FIG. 4. As the temperature is increased, the emission intensity is reduced, and the emission peak is redshifted to about 208 nm. Part (a) of FIG. 4 shows the temperature dependence of the integrated PL intensity. As seen in the inset of part (b) of FIG. 4, an estimated internal quantum efficiency (IQE) of about 30% is obtained, by taking the ratio of integrated PL intensities at room and low temperatures, assuming near-unity quantum efficiency at low temperature. The droop is likely due to heating and other non-ideal effects under high laser excitation conditions. For comparison, shown in part (b) of FIG. 4, the near-band-edge PL emission of this example (402) is nearly twice as strong as a commercial AlN epitaxial template (404; DOWA Electronics Materials Co., Ltd.) that is about 10 times thicker.

AlN epilayers and other semiconductor layers with various thicknesses may be formed by extending the epilayer growth duration (Stage IV of FIG. 1).

Figure 5:
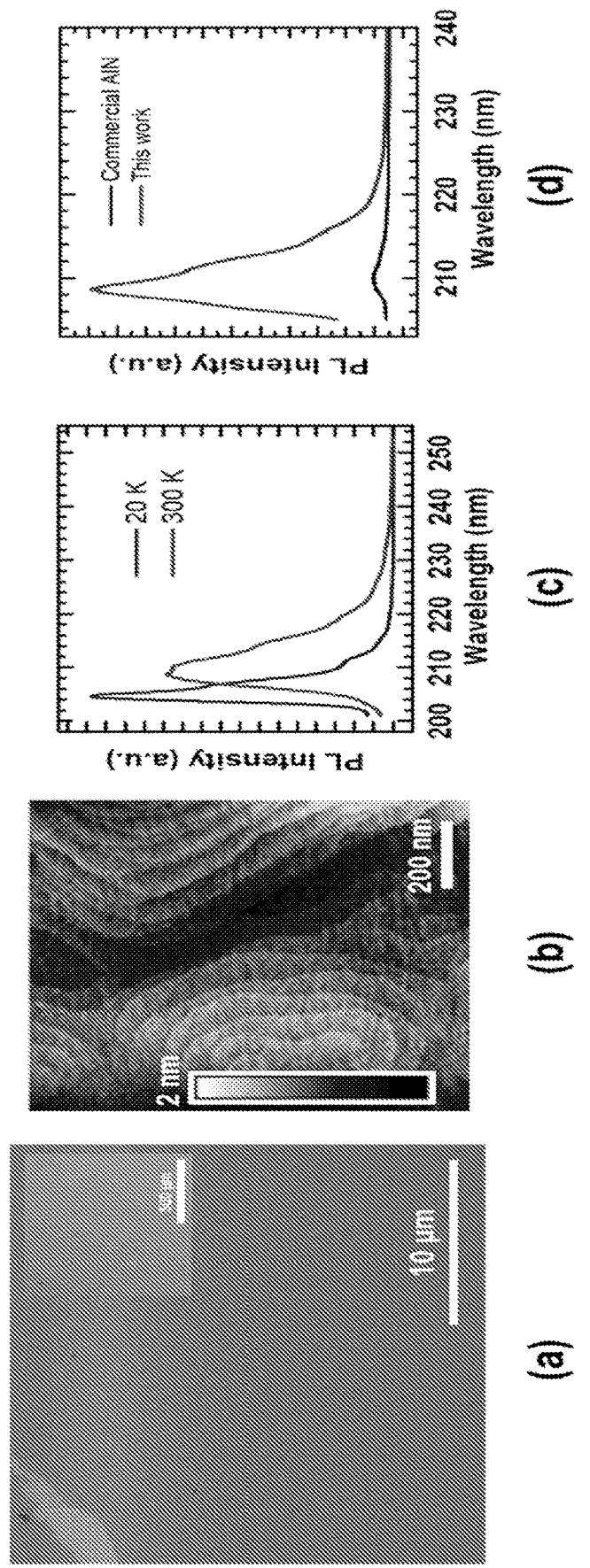
FIG. 5 depicts further images of the semiconductor layer of FIG. 1 in greater detail, along with graphical plots of the spectrum of the semiconductor layer of FIG. 1 at room and cryogenic temperatures, and of the intensity of the semiconductor layer of FIG. 1 in comparison to a commercially available template.

FIG. 5 depicts a 1-µm-thick example in part (a) in which a low-magnification SEM image of the example surface is presented. An intentional scratch mark on the top left corner was provided to properly focus on the example surface. An optical image is included as the inset. In part (b) of FIG. 5, a high-magnification AFM image of the example surface topology is presented. FIG. 5 also includes a part (c) in which a PL spectrum of the example at room (300 K) and cryogenic (20 K) temperatures is depicted. FIG. 5 also includes a part (d) in which a comparison of the PL intensity of the same example 402 (FIG. 4) and the commercial AlN epitaxial template 404 (FIG. 4) is presented.

For an example having a thickness of 1 µm, the (002) and (102) X-ray rocking curve peaks have FWHM values about 60 arcsec and 1050 arcsec, respectively. Using a Hitachi SU8000 scanning electron microscope (SEM), an overall uniform and smooth surface can be seen in part (a) of FIG. 5 of this example's surface, with an absence of hillocks or cracks commonly seen after the growth of lattice mismatched layers due to strain. This holds true at the entire wafer scale, as verified by optical microscopy, with an image included as inset. A Bruker Dimension Icon atomic force microscope (AFM) was used in tapping mode in air to obtain the 1×1 µm² surface topology (part (b) of FIG. 5). The observed terraces are of atomic steps corresponding to the top epitaxial monolayers that did not fully form at the end of growth.60 The root mean square (RMS) roughness is about 0.3 nm.

The PL spectra at room and cryogenic temperatures are shown in part (c) of FIG. 5. The PL intensity is about 20 times stronger than the commercial AlN epitaxial template with similar 1 µm thickness (part (d) of FIG. 5). Further improvements in material quality are expected with more refined surface treatment methods of the sapphire substrate.

Figure 6:
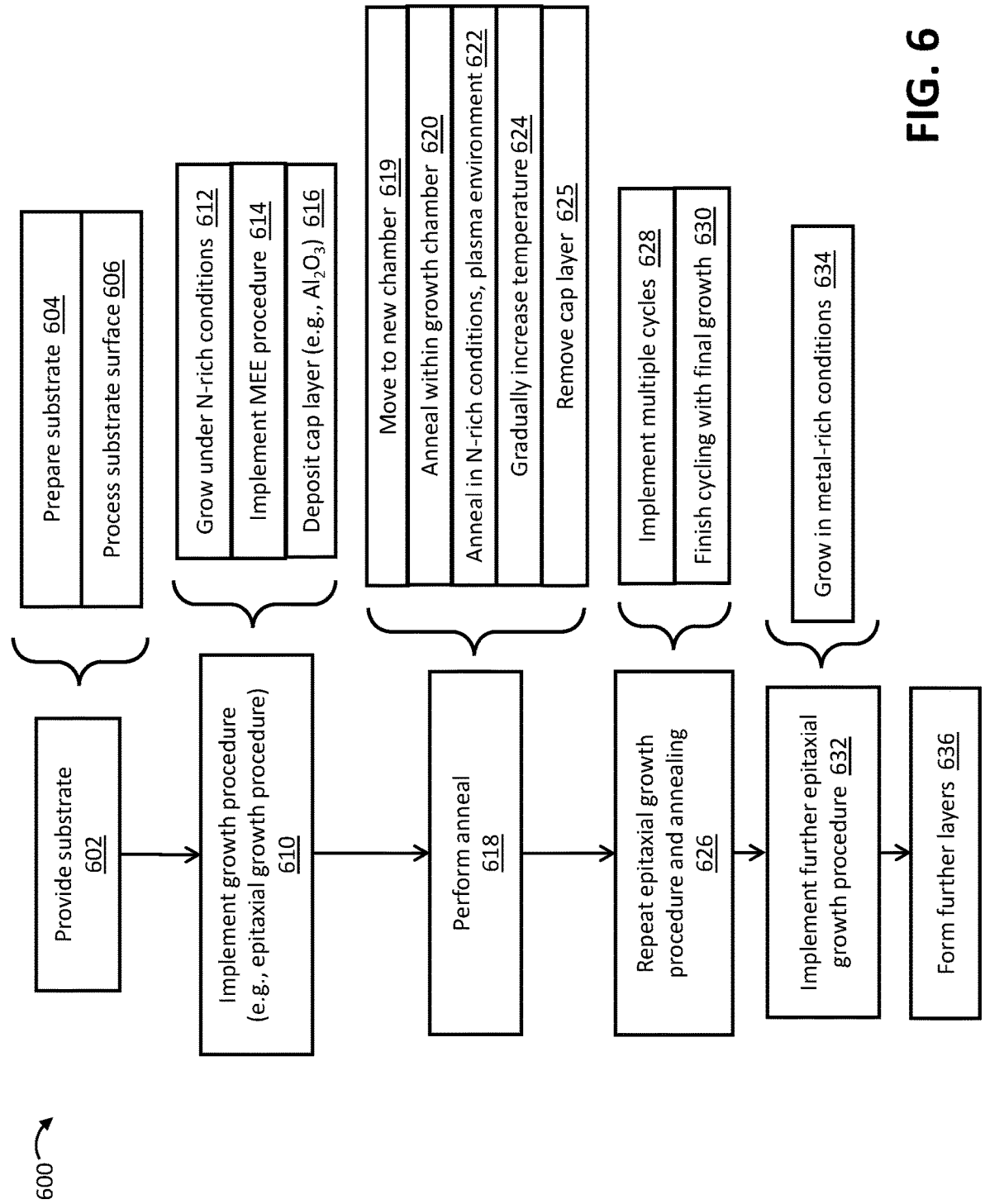
FIG. 6 is a flow diagram of a method of fabricating a semiconductor device having a semiconductor layer grown with growth-anneal cycling in accordance with one example.

FIG. 6 depicts a method 600 of fabricating a semiconductor device in accordance with one example. The method 600 may be used to manufacture any type of semiconductor device described herein or another type of semiconductor device. The method 600 may include additional, fewer, or alternative acts. For instance, the method 600 may or may not include one or more acts directed to preparing a substrate for further processing.

The method 600 may begin with an act 602 in which a substrate is provided. The substrate may be or be formed from a sapphire wafer. Other substrates may be used. Providing the substrate may include preparation of the substrate in an act 604. For instance, preparation may include one or more cleaning procedures. Alternatively or additionally, the act 604 may include one or more doping procedures. Providing the substrate may include processing the surface of the substrate in an act 606. For example, the substrate surface may be smoothed or otherwise processed to facilitate epitaxial growth thereon.

In some cases, the preparation of the substrate may include deposition or other formation of one or more layers (e.g., metal layers) on either side (e.g., a backside) of the substrate. The function of the layer(s) may vary. As described above, in some cases, a metal layer may be deposited to allow for efficient heat conduction in vacuum. For example, molybdenum and/or another efficient thermal conductor may be deposited. The manner in which the layers are formed may vary.

In an act 610, a growth procedure is implemented to form a semiconductor layer on (e.g., directly on), or otherwise supported by, the substrate. In some cases, the growth procedure is or otherwise includes an epitaxial growth procedure. Alternatively or additionally, the growth procedure is or includes a non-epitaxial growth procedure, such as a pulsed laser deposition procedure. In non-epitaxial cases, the growth may not include or involve crystal or lattice formation. Crystallization or other lattice formation occurs in such cases subsequently during the anneal.

In some cases, the epitaxial or other growth procedure is implemented, and the anneal is performed, in an act 612 in which growth occurs in nitrogen-rich conditions. In epitaxial cases, the act 610 may include implementation of a migration-enhanced epitaxy (MEE) procedure (act 614). The semiconductor layer may include aluminum nitride, but other semiconductors may be grown.

The semiconductor layer may be configured as a buffer or other layer. The buffer layer may be grown directly on the substrate. In such cases, no intermediate layer or other intermediary is present between the semiconductor layer and the substrate, despite the lattice mismatch therebetween. For instance, the buffer layer may be composed of, or otherwise include, AlN grown on a sapphire substrate or other substrate of uniform composition differing from the semiconductor layer. The semiconductor layer and the substrate may or may not have a lattice mismatch, as described herein.

In some cases, the act 610 includes the deposition or other formation of a cap (or capping) layer and/or other layer in an act 616. The cap layer may be deposited, grown or otherwise formed on the semiconductor layer being grown in the act 610 to provide a barrier and/or act as a sacrificial layer in subsequent processing, such as the anneal procedure described below. For instance, the cap layer may protect the semiconductor layer during the anneal. The protection may include or involve prevention of evaporation. The semiconductor layer may accordingly reach temperatures at which deformation occurs (e.g., above the decomposition temperature), but without significant loss of material.

The cap layer may have a composition or be otherwise configured to withstand the high temperature environment of the anneal. However, the composition and other characteristics of the cap layer may vary. For instance, the cap layer may or may not have the same or similar composition to the semiconductor layer being grown in the act 610. In some cases, the cap layer is composed of, or otherwise includes, aluminum oxide, but other oxides or materials may be used.

The cap layer may be a thin layer. For instance, the cap layer may be sufficiently thin to avoid a thermal insulating effect. The cap layer may have a thickness that allows the semiconductor layer to reach an anneal (or other desired) temperature during the anneal. In some cases, the cap layer has a thickness falling in a range from about 10 nm to about 20 nm. However, other thicknesses may be used, including, for instance, thicknesses up to 100 nm.

In an act 618, an anneal of the semiconductor layer is performed. In some cases, the anneal is performed in a different chamber than the growth chamber. The device may accordingly be moved to a new chamber in an act 619. In other cases, the anneal is performed in situ, or without exposure to ambient conditions between the growth in the act 610 and the anneal of the act 618. For example, the anneal may be performed in a growth chamber in which the epitaxial growth procedure is implemented (act 620). The acts 616 and 618 may thus be performed in the same chamber. In some cases, the anneal is performed in nitrogen-rich conditions and/or in a plasma environment of the epitaxial growth procedure (act 622). In other cases, the acts 616 and 618 are performed in multiple chambers that are connected, configured or otherwise integrated to avoid exposure to ambient conditions.

The anneal is conducted at a higher temperature than the epitaxial growth procedure. For instance, the anneal may include gradually increasing a temperature of the growth chamber (act 624). In some cases, the temperature may reach a temperature over 50% higher than the epitaxial growth procedure.

The anneal is conducted at or above a decomposition temperature for the semiconductor layer. Thus, in some cases, the anneal is conducted at a temperature at which decomposition of the semiconductor layer occurs. In other cases, the anneal may not result in decomposition of the semiconductor layer due to, for instance, the presence of a cap layer and/or other layer, despite the anneal temperature being at or above the decomposition temperature.

The decomposition temperature may vary considerably. For instance, the decomposition temperature may vary based on the composition of the semiconductor layer. The decomposition temperature may also vary based on the pressure and/or other conditions of the anneal. For example, for GaAs, decomposition may occur at 600 Celsius in vacuum. However, with arsenic overpressure, GaAs may be stable (i.e., no decomposition) at 700 Celsius. The decomposition behavior of GaN and AlN may have present similar characteristics. In vacuum, GaN may start decomposing at 900 Celsius, and AlN starts decomposing above 1200 Celsius. But the decomposition temperature may be increased with nitrogen overpressure.

In cases in which a cap layer was formed to protect the semiconductor layer, the cap layer is removed in an act 625 following the anneal. The cap layer may be removed via an etch procedure, such as a wet etch. The nature of the procedure may vary in accordance with the composition of the cap layer.

In an act 626, the epitaxial growth procedure and the anneal are repeated or cycled. In some cases, the epitaxial growth procedure and the anneal are repeating for multiple cycles act 628), such as at least three cycles. The repetition or cycling may end with implementation of a final growth procedure (act 630).

In some cases, the method 100 includes an act 632 in which a further epitaxial growth procedure is implemented to further form the semiconductor layer after repeating the epitaxial growth procedure and the anneal. The further epitaxial growth procedure may be implemented in different conditions than the growth phases of the acts 610, 626. For instance, the growth may be implemented in metal-rich conditions (act 634).

The method 100 may then include an act 636 in which one or more further layers or other elements of the semiconductor device are fabricated. For instance, one or more further semiconductor layers may be grown or otherwise formed to establish, e.g., a heterostructure. Alternatively or additionally, one or more metal layers may be deposited or otherwise formed to define a contact, interconnect, or other circuit element.

The order in which the acts of the method 600 are implemented may vary in other examples. For example, one or more layers or other elements of the semiconductor device may be formed before the formation of the semiconductor layers described herein.

Described above are methods of fabrication in which AlN epilayers (or other semiconductor layers) are grown (e.g., directly grown) on sapphire using a high-temperature-assisted MBE process. Strain-free ultrathin AlN epilayers were obtained directly on sapphire by utilizing in situ high-temperature annealing. The optical properties are better than commercial AlN templates, which is consistent with the excellent structural properties of the semiconductor layers grown via the disclosed methods.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A method of fabricating a semiconductor device, the method comprising:
   providing a substrate;
   implementing a growth procedure to form a semiconductor layer supported by the substrate;
   performing an anneal of the semiconductor layer, wherein the anneal is conducted at a higher temperature than the growth procedure; and
   repeating the growth procedure and the anneal;
   wherein the anneal is conducted at or above a decomposition temperature for the semiconductor layer such that performing the anneal comprises decomposing a portion of the semiconductor layer.

2. The method of claim 1, wherein repeating the growth procedure and the anneal comprises repeating the growth procedure and the anneal for multiple cycles.

3. The method of claim 1, wherein the growth procedure and the anneal are implemented without exposure of the semiconductor layer to ambient conditions between the growth procedure and the anneal.

4. The method of claim 1, wherein the anneal is performed in a growth chamber in which the growth procedure is implemented.

5. The method of claim 1, wherein the growth procedure and the anneal are conducted in different chambers.

6. The method of claim 1, further comprising implementing a further growth procedure to further form the semiconductor layer after repeating the growth procedure and the anneal.

7. The method of claim 6, wherein the further growth procedure is implemented in metal-rich conditions.

8. The method of claim 1, wherein the anneal is performed in a plasma environment of the growth procedure.

9. The method of claim 1, wherein the growth procedure is implemented, and the anneal is performed, in a growth chamber in nitrogen-rich conditions.

10. The method of claim 1, wherein the growth procedure comprises an epitaxial growth procedure.

11. The method of claim 1, wherein:
    implementing the growth procedure comprises growing the semiconductor layer directly on the substrate; and
    the substrate has a uniform composition differing from the semiconductor layer.

12. The method of claim 1, wherein:
    the semiconductor layer comprises aluminum nitride; and
    the substrate comprises sapphire.

13. The method of claim 1, wherein the semiconductor layer comprises a III-V semiconductor material.

14. The method of claim 1, wherein performing the anneal comprises gradually increasing a temperature of a growth chamber.

15. The method of claim 1, wherein the anneal is performed at a temperature over 50% higher than the growth procedure.

16. The method of claim 1, wherein the semiconductor layer and the substrate have a lattice mismatch.

17. A method of fabricating a semiconductor device, the method comprising:
    providing a substrate;
    implementing a growth procedure to form a semiconductor layer on the substrate;
    performing an anneal of the semiconductor layer, wherein the anneal is conducted at a higher temperature than the growth procedure; and
    repeating the growth procedure and the anneal;
    wherein the anneal is conducted at a temperature at which decomposition of the semiconductor layer occurs,
    wherein implementing the growth procedure comprises depositing a cap layer on the semiconductor layer after the growth procedure is completed and before the anneal is performed, the cap layer being configured to prevent decomposition of the semiconductor layer during the anneal, and
    wherein performing the anneal comprises removing the cap layer after the anneal is conducted.

18. The method of claim 17, wherein the growth procedure and the anneal are implemented without exposure of the semiconductor layer to ambient conditions between the growth procedure and the anneal.

19. The method of claim 17, wherein repeating the growth procedure and the anneal comprises repeating the growth procedure and the anneal for multiple cycles.

20. The method of claim 17, further comprising implementing a further growth procedure to further form the semiconductor layer after repeating the growth procedure and the anneal, wherein the further growth procedure is implemented in metal-rich conditions.

21. A method of fabricating a semiconductor device, the method comprising:
    providing a substrate;
    implementing an epitaxial growth procedure to form a semiconductor layer on the substrate;
    performing an anneal of the semiconductor layer, wherein the anneal is conducted at a higher temperature than the epitaxial growth procedure; and
    repeating the epitaxial growth procedure and the anneal for multiple cycles;
    wherein the anneal is conducted at a temperature at which decomposition of the semiconductor layer occurs such that performing the anneal comprises decomposing a portion of the semiconductor layer.

22. The method of claim 21, wherein the epitaxial growth procedure and the anneal are implemented without exposure of the semiconductor layer to ambient conditions between the epitaxial growth procedure and the anneal.

* * * * *